(12) United States Patent
Backlund et al.

(10) Patent No.: US 7,646,567 B2
(45) Date of Patent: Jan. 12, 2010

(54) FLEX ON SUSPENSION WITH A HEAT-CONDUCTING PROTECTIVE LAYER FOR REFLOWING SOLDER INTERCONNECTS

(75) Inventors: David Daniel Backlund, Prior Lake, MN (US); Rick Pfahl Freeman, Northfield, MN (US); Andrew Robert Motzko, Delano, MN (US); Erik Jon Lindquist, Oakdale, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 143 days.

(21) Appl. No.: 11/168,792

(22) Filed: Jun. 28, 2005

(65) Prior Publication Data

US 2006/0292738 A1 Dec. 28, 2006

(51) Int. Cl.
*G11B 5/55* (2006.01)
*H04R 31/00* (2006.01)
(52) U.S. Cl. .................... 360/264.2; 29/603.04
(58) Field of Classification Search .......... 174/254; 360/264.2, 266.3; 361/750, 751; 29/603.04, 29/603.06
See application file for complete search history.

(56) References Cited

U.S. PATENT DOCUMENTS

| | | | | |
|---|---|---|---|---|
| 5,177,863 A * | 1/1993 | Lam | .............. | 29/830 |
| 5,517,756 A * | 5/1996 | Shirai et al. | .............. | 29/847 |
| 5,864,118 A | 1/1999 | Backlund | .............. | 219/233 |
| 6,119,923 A | 9/2000 | Vinciarelli et al. | .............. | 228/179.1 |
| 6,147,326 A | 11/2000 | Backlund | .............. | 219/243 |
| 6,222,135 B1 * | 4/2001 | Daido et al. | .............. | 174/250 |
| 6,420,659 B1 * | 7/2002 | Tsutsumi et al. | .............. | 174/254 |
| 6,543,673 B2 | 4/2003 | Lennard et al. | .............. | 228/179.1 |
| 6,636,382 B2 * | 10/2003 | Shiraishi | .............. | 360/244.3 |
| 6,801,402 B1 | 10/2004 | Subrahmanyam et al. | .............. | 360/245.9 |
| 6,807,029 B2 * | 10/2004 | Someya | .............. | 360/245.9 |
| 7,414,814 B1 * | 8/2008 | Pan | .............. | 360/264.2 |
| 7,423,219 B2 * | 9/2008 | Kawaguchi et al. | .............. | 174/254 |
| 2002/0154454 A1 | 10/2002 | Kupinski et al. | .............. | 360/323 |
| 2006/0034018 A1 * | 2/2006 | Deguchi et al. | .............. | 360/245.9 |

OTHER PUBLICATIONS

Iannetta, Roger A. Jr., May 10-12, 1994, "Successful case histories of polymer based circuitry on flexible film substrates", Electro International 1994, p. 885-889.*

* cited by examiner

*Primary Examiner*—Julie Anne Watko
(74) *Attorney, Agent, or Firm*—Fellers, Snider, et al.

(57) ABSTRACT

A FOS is provided for electrically connecting a data transfer head with a PCCA. The FOS comprises a polymeric layer supporting an electrical trace. The electrical trace comprises an uninsulated pad surface configured for electrically engaging a solder interconnect of the PCCA. The polymeric layer comprises a continuous portion covering the pad and opposing the pad surface. A method is provided comprising providing the FOS comprising the electrical trace and the polymeric covering, contactingly engaging the pad surface portion of the trace with the solder interconnect portion of the PCCA, and conducting heat through the polymeric covering to reflow the solder interconnect, thereby electrically connecting the FOS to the PCCA.

21 Claims, 7 Drawing Sheets

US 7,646,567 B2

FLEX ON SUSPENSION WITH A HEAT-CONDUCTING PROTECTIVE LAYER FOR REFLOWING SOLDER INTERCONNECTS

FIELD OF THE INVENTION

The claimed invention relates generally to the field of data transfer devices and more particularly but without limitation to providing electrical integrity to soldered connections in miniaturized components.

BACKGROUND

Data storage devices employ actuators to position data storing and retrieving heads in a data transfer relationship with a storage medium. Exponential growth in the areal density of data storage, combined with rising popularity for data storage products in ever-smaller packages, have driven the continual miniaturization of data storage device components. For example, current and near-future manufacturing requirements include the soldering of multitudes of components within each data storage device that can be less than twelve microns thick, and in a fast-paced manufacturing environment.

Some previous solutions have deviated from traditional solder reflow techniques of joining the electrical components. Sonic reflow, laser reflow, and reflow oven processes have provided mixed results at best. Other previous solutions have aimed at improving the traditional solder reflow techniques, such as by modifying the heat bar configuration and the methods of applying the heat and pressure to the solder connection.

What is needed is a solution that precisely and repeatedly controls the thermal energy from the heat bar to the solder interconnect, and that applies an amount of pressure that aids in the reflow but does not distort the integrity of the finished electrical connection. It is to these improvement features that the embodiments of the present invention are directed.

SUMMARY OF THE INVENTION

Embodiments of the present invention are generally directed to a head gimbal assembly of a data storage device.

In some embodiments a flex on suspension (FOS) assembly is provided for electrically connecting a data transfer head with a printed circuit cable assembly (PCCA). The FOS comprises a polymeric layer and an electrical trace supported by the polymeric layer. The electrical trace comprises a pad with an uninsulated pad surface configured for electrically engaging a solder interconnect of the PCCA. The polymeric layer comprises a continuous portion covering the pad and opposing the pad surface.

In some embodiments a method is provided comprising providing a FOS with an electrical trace and a polymeric covering, contactingly engaging a pad portion of the trace with a solder interconnect portion of a circuit, such as the PCCA, and conducting heat through the polymeric covering to reflow the solder interconnect, thereby electrically connecting the FOS to the circuit.

In some embodiments a data storage device is provided, comprising a data transfer head in a data storing and retrieving relationship with a storage medium, and means for electrically connecting the head with a controlling processor. The means for electrically connecting can be characterized by conducting sufficient heat from a heat bar through a protective layer supporting an electrical contact to reflow a solder interconnect. The means for electrically connecting can be characterized by imparting mechanical pressure from the heat bar to the solder interconnect without contactingly engaging either the electrical contact or the solder interconnect.

These and various other features and advantages which characterize the claimed invention will become apparent upon reading the following detailed description and upon reviewing the associated drawings.

DETAILED DESCRIPTION

Figure 1:
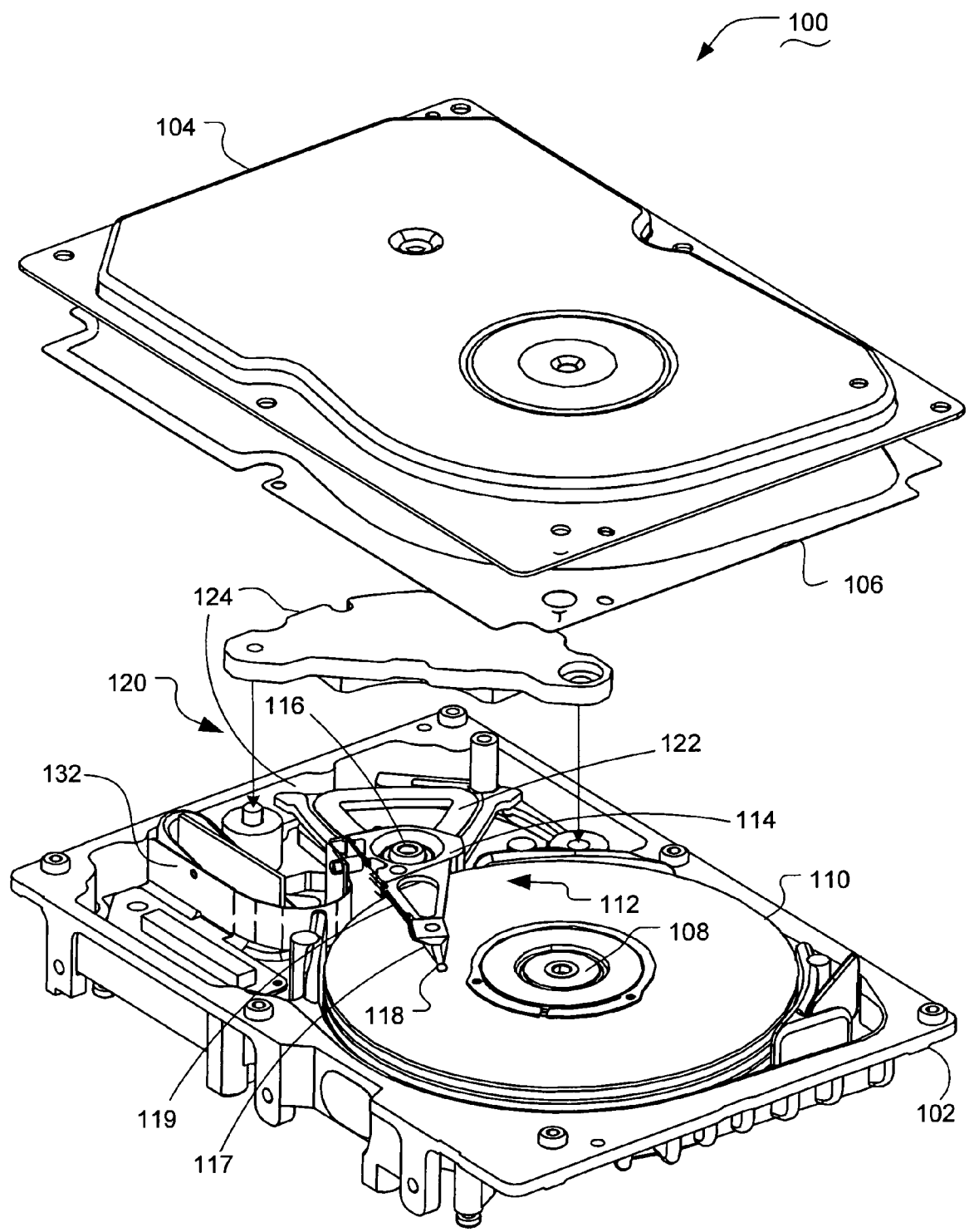
FIG. 1 is an exploded isometric view of a data storage device constructed in accordance with embodiments of the present invention.

Turning to the drawings as a whole and particularly now to FIG. 1 which is an exploded isometric view of a data storage device 100 in which embodiments of the present invention can be practiced. The data storage device 100 has a base 102 to which a cover 104 is attached with a sealing member 106 sandwiched therebetween to establish a sealed enclosure. Within the enclosure a spindle motor 108 rotates one or more data storage mediums ("discs") 110. Each of the discs 110 is formatted to define tracks in which data is recorded.

An actuator assembly, such as a rotary actuator 112, has a central body (or "eblock") 114 that is pivotable around a bearing 116 to place a data transfer head 118 in a data transfer position in relation to a desired track.

A motor, such as a voice coil motor 120, pivots the actuator 112 in order to move the heads 118 radially across the discs 110 to access the tracks. The voice coil motor 120 includes an electrical coil 122 mounted on the side of the actuator body 114 opposite the heads 118 so as to be immersed in the magnetic field of an array of permanent magnets 124. When controlled DC current is passed through the coil 122, an electromagnetic field is set up that interacts with the magnetic field of the permanent magnets 124 and causes the coil 122 to move relative to the permanent magnets 124 in accordance with the well-known Lorentz relationship.

A gimbal assembly 117 connects the head 118 both mechanically and electronically to the actuator 112 and to the data storage device 100 control circuit. The head 118, in addition to having read and write elements, also has a slider assembly for flying the head 118 on a fluid bearing created by spinning the discs 110. The gimbal assembly 117 typically includes a FOS 130 (FIG. 2) for electrically connecting the read and write elements on the head 118 to a PCCA 132 which, in turn, is connected to a control board usually mounted to a bottom side of the base 102 (not shown). The control board includes a plurality of control processors that control the data storing and retrieving activities of the head 118 and the discs 110.

Figure 2:
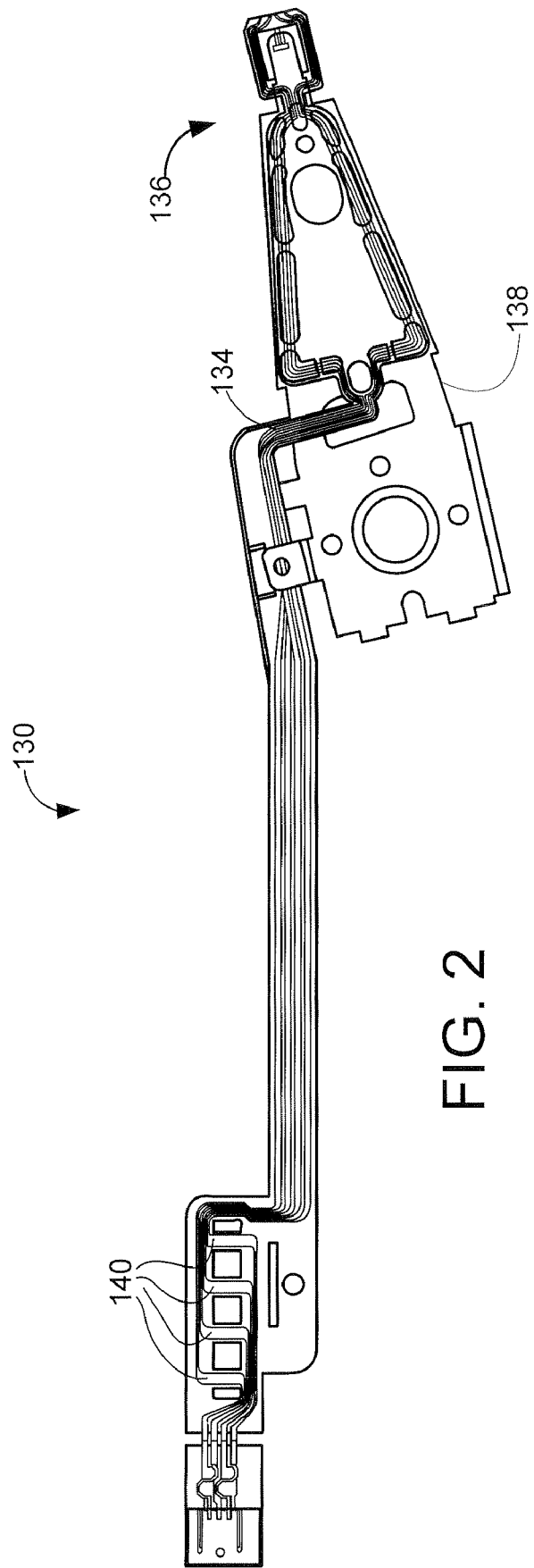
FIG. 2 is a plan view of a FOS of the data storage device of FIG. 1.
Figure 3:
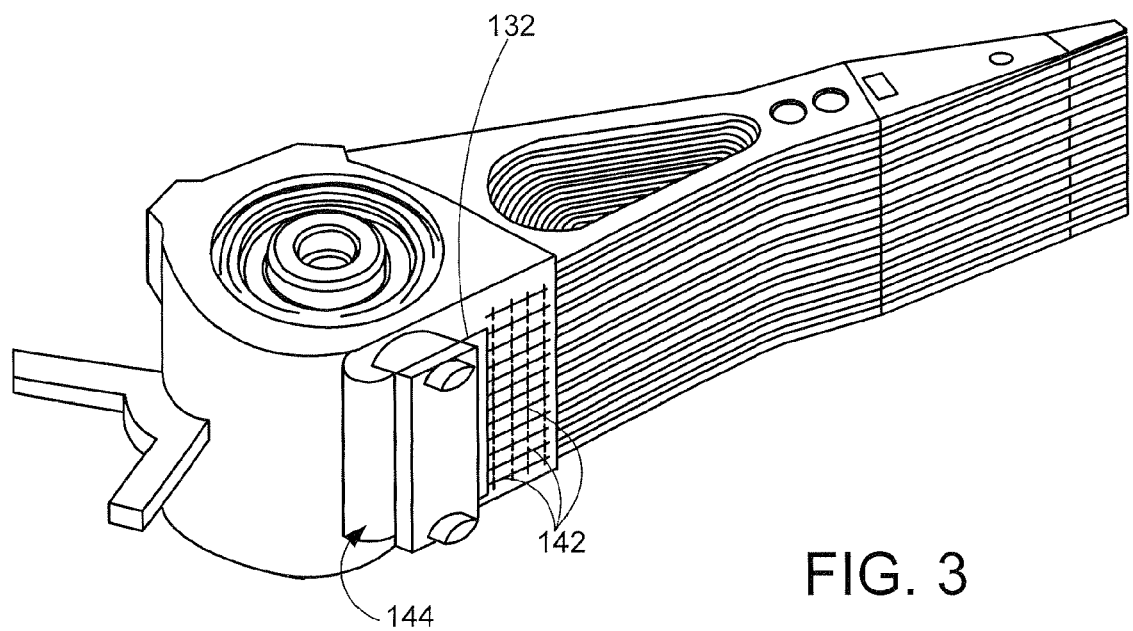
FIG. 3 is an isometric view of the actuator body of FIG. 1 showing the manner of attaching a distal end of the FOS to the PCCA.

FIG. 2 is an enlarged plan view of a FOS 130 that is suited for use in embodiments of the present invention. It will be noted that the FOS 130 has a plurality of electrically conductive traces 134 that communicate electronic signals from a trace gimbal assembly 136, across a load beam suspension member 138, terminating at a distal end as a plurality of pads 140. While generally the electrical traces 134 are covered with an insulative material, such as a dielectric material, the pads 140 have uninsulated pad surfaces in order that they can be readily engaged with mating electrical terminals 142 (FIG. 3) on a connector portion 144 of the PCCA 132. For example, as discussed further below, the connector portion 144 can have an array of solder interconnects for contactingly engaging the pads 140, and that can be reflowed to electrically connect the FOS 130 to the PCCA 132.

Figure 4:
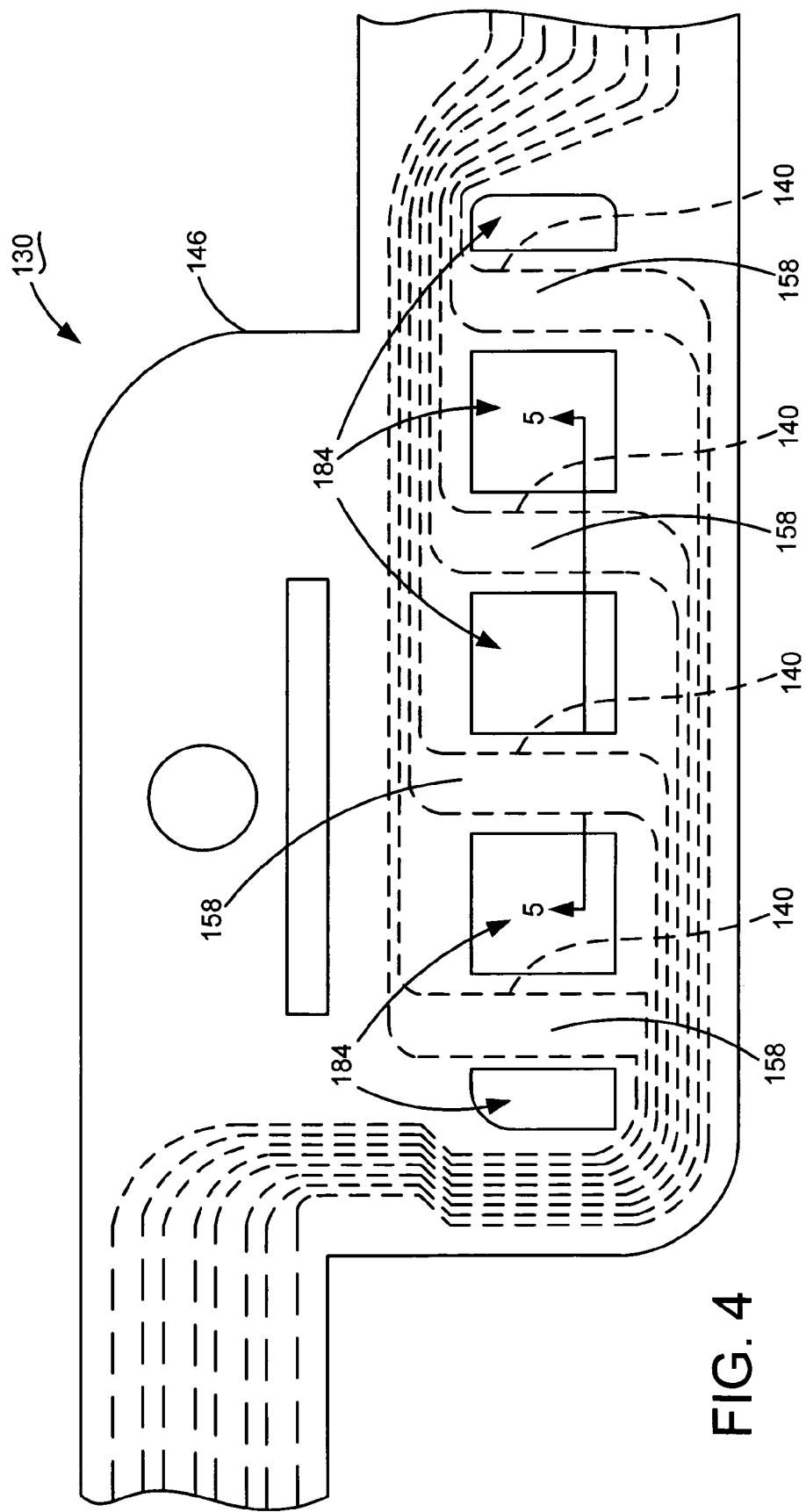
FIG. 4 is an enlarged detail view of a portion of the FOS of FIG. 2.

FIG. 4 is an enlarged plan view of a portion of the FOS 130 illustrating a construction contemplated by the embodiments of the present invention. It will be noted that in the embodiments illustrated by FIGS. 2-5 there are four pads 140. Alternative equivalent embodiments might have more or fewer pads 140, but they would be electrically connected in the manner described herein regardless of the number.

Figure 5:
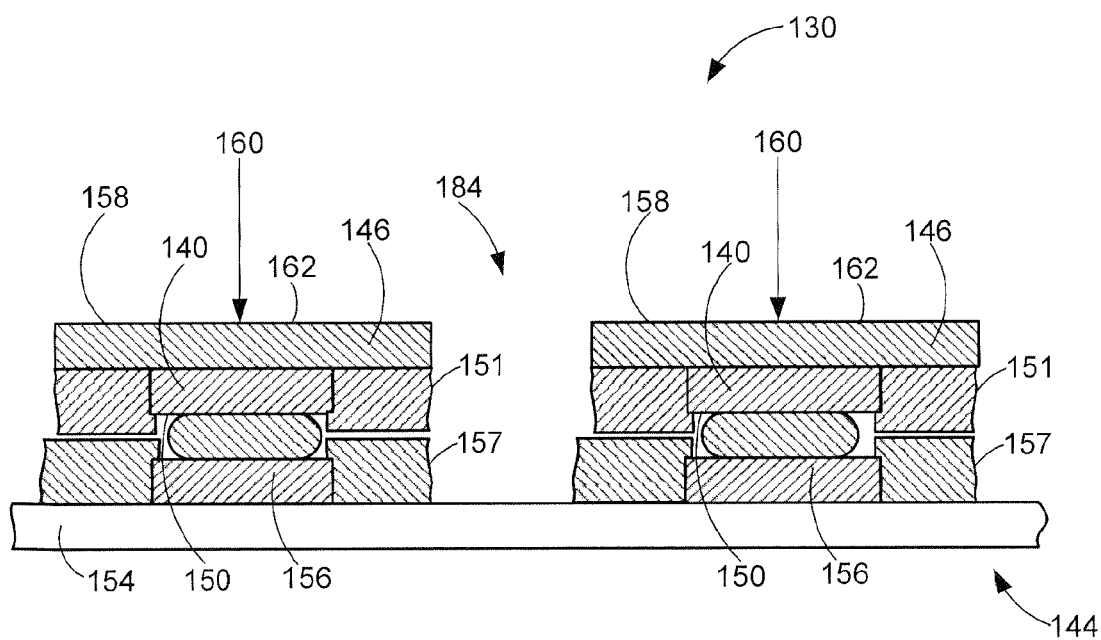
FIG. 5 is a diagrammatic cross sectional view taken along the line 5-5 of FIG. 4.

A polymeric layer 146 supports the electrical traces 134, such as by adhesion thereto. Preferably, the polymeric layer 146 is made from a polyimide material, such as is manufactured by E.I. Dupont De Nemours Co. and marketed under the trademark "Kapton." Staying with FIG. 4 and now further considering FIG. 5, which is a diagrammatic cross sectional view taken along the line 5-5 of FIG. 4. A cover coat 151, such as a dielectric material, electrically insulates the electrical traces 134 except for where they are to be electrically connected. For example, the pads 140 have uninsulated pad surfaces 150 that are configured for electrically engaging a solder interconnect 152 of the connector portion 144 of the PCCA 132. The connector portion 144 is also shown to have a base layer 154 supporting an electrical contact pad 156, as well as a cover coat 157 otherwise insulating electrical traces supported by the layer 154. The cross sectional illustration of FIG. 5 is simplified for clarity in that it does not show the adhesive layers associated with the various layers, which is not necessary for an understanding of the scope of the embodiments of the present invention.

The polymeric layer 146 comprises continuous portions 158 covering the respective pads. Accordingly, the polymeric layer 146 acts as a heat conducting protective layer when a heat bar is used to reflow the solder interconnect 152 in order to electrically connect the pads 140, 156. That is, a heat bar acting in a direction designated by arrow 160 and contactingly engaging an outer surface 162 of the polymeric layer 146 can be used to apply pressure to the solder interconnect 152 without contactingly engaging either of the pads 140, 156 or the solder interconnect 152. In other words, heat from the heat bar must be conducted through the polymeric layer 146 in order to reflow the solder interconnect 152. The protection provided by the polymeric layer 146 delivers a more controlled transfer of heat and pressure, thereby resulting in a more robust reflow connection, especially when used in extremely thin pads 140, 156 such as those that are of a thickness of twelve microns and less.

Figure 6:
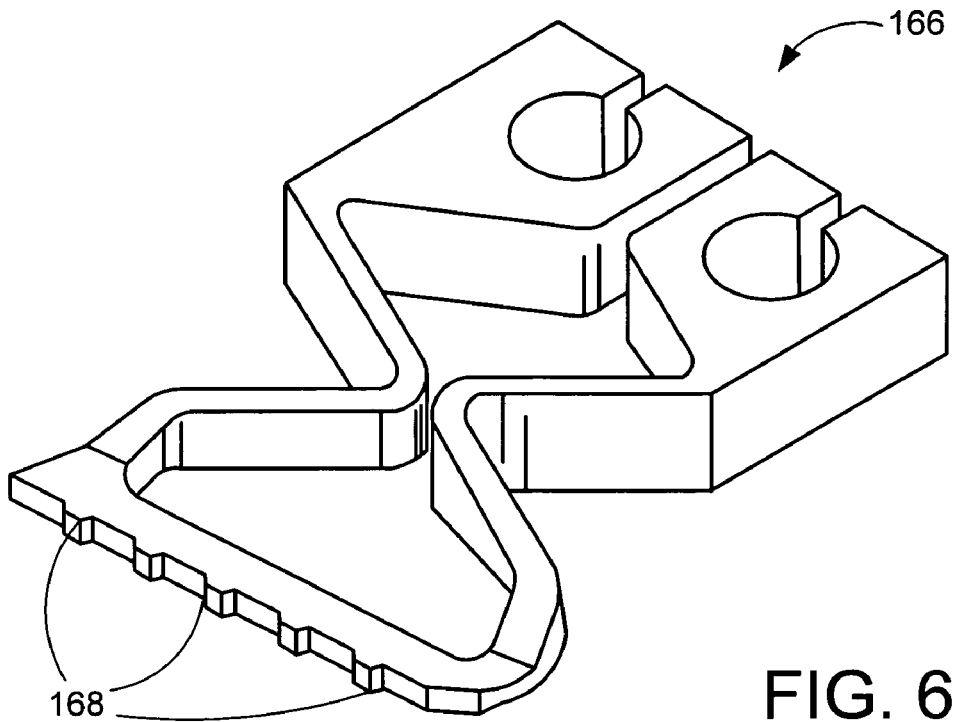
FIG. 6 is a raised tip heat bar used in previous solutions.
Figure 7:
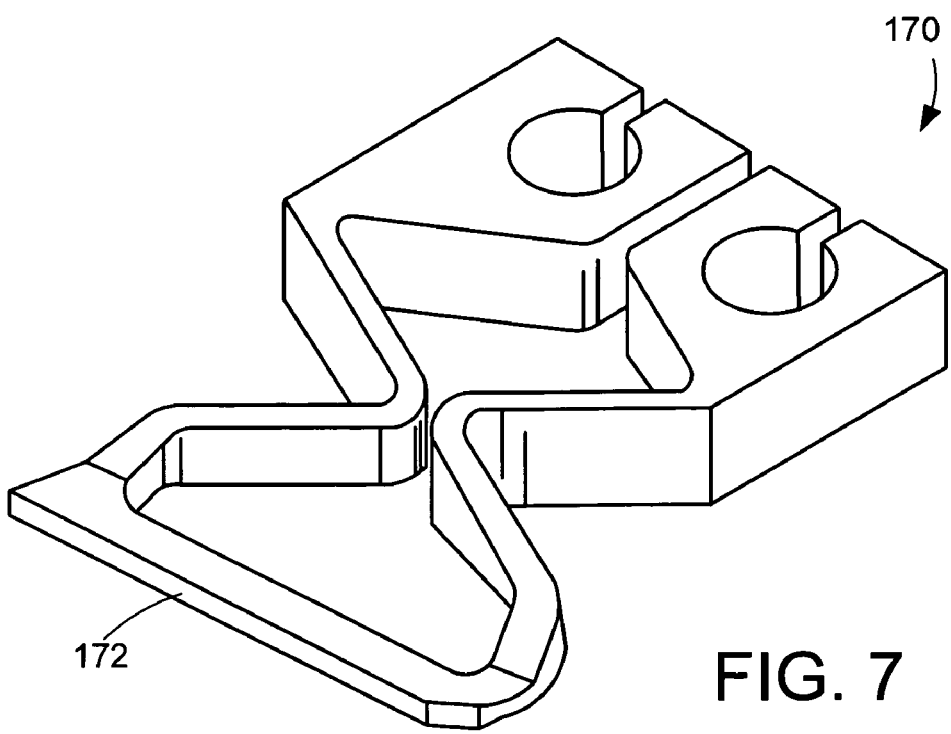
FIG. 7 is a simplified straight tip heat bar preferred for use in the embodiments of the present invention.

The protective benefits of the polymeric layer 146 also permits simplification of the soldering manufacturing process. For example, FIG. 6 is an isometric view of a heat bar tip 166 used in previous solutions to reflowing solder on miniaturized components. The heat bar tip 166 defines a number of raised soldering surfaces 168 that are intended to localize the heat transferred to the solder interconnects 152. However, these raised soldering surfaces 168 must be maintained uniformly in order to produce an even distribution of pressure on the plurality of interconnects being simultaneously reflowed. Also, it becomes very important that the raised soldering surfaces 168 be placed in a precise alignment with the plurality of solder interconnects 152. Contrarily, conducting the reflow heat through the polymeric layer 146, in accordance with present embodiments, eliminates the need for the raised surfaces 168. The heat bar tip 170 of FIG. 7, having a straight tip 172 is preferable for use with the embodiments of the present invention, eliminating the tool maintenance and alignment concerns associated with the previous solutions.

Figure 8:
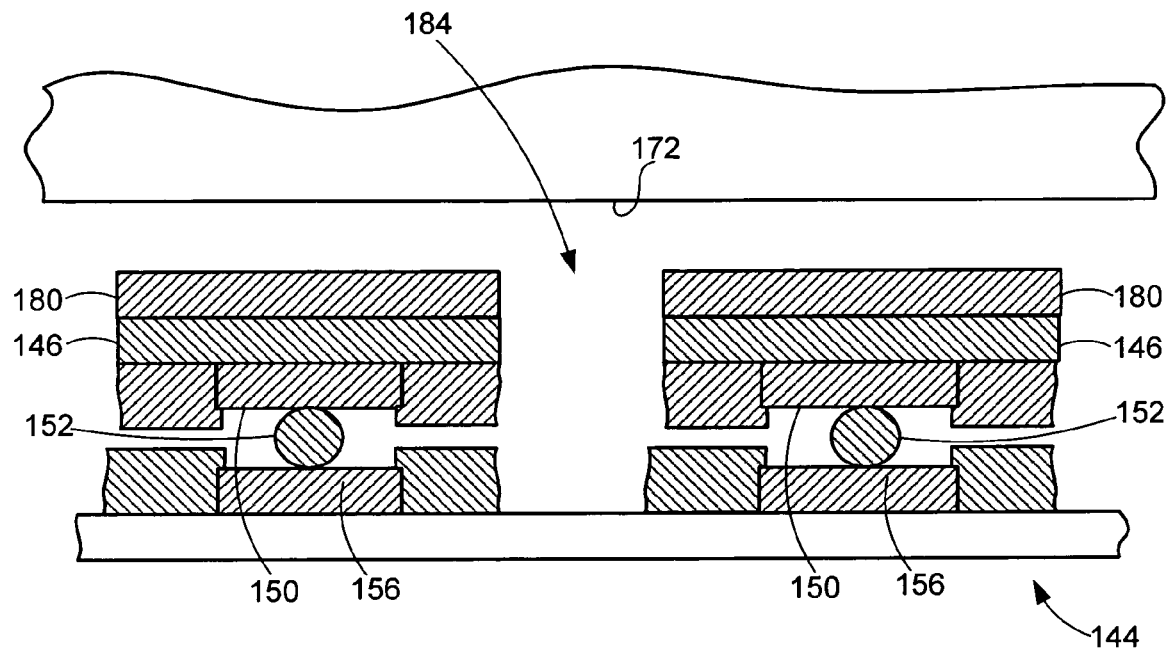
FIGS. 8 and 9 are diagrammatic cross sectional views similar to FIG. 5 but having a stainless steel layer attached to the polymeric layer.
Figure 9:
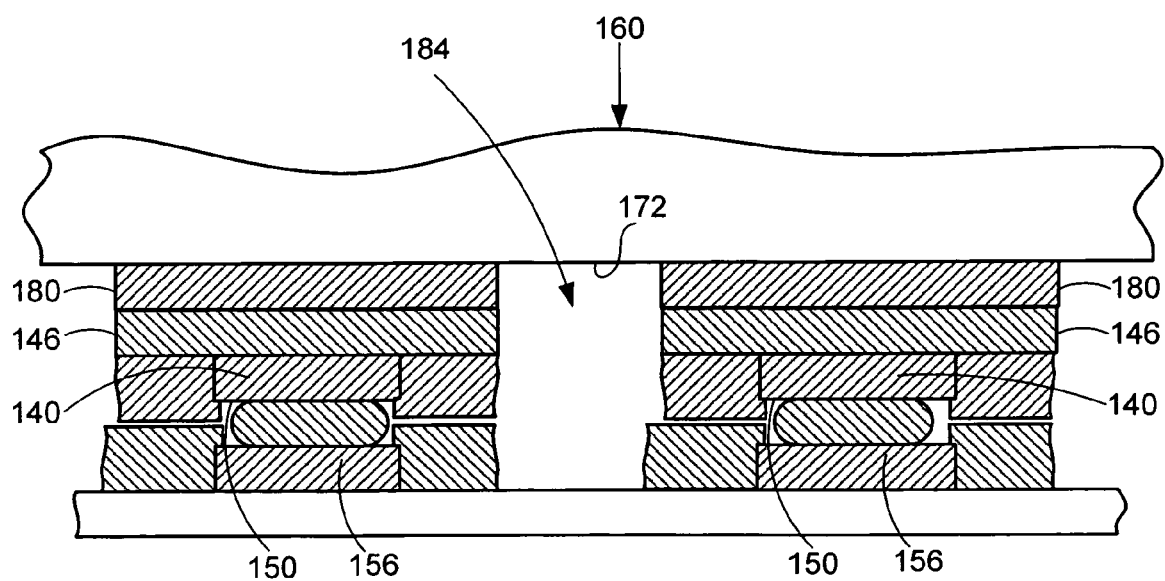

FIGS. 8 and 9 illustrate in equivalent alternative embodiments one or more additional layers can be added as protective layers in addition to the polymeric layer 146. For example, a stainless steel layer 180 has been proven effective in further enhancing the heat distribution to predictably reflow the solder interconnect 152. The stainless steel layer 180 also acts as a stiffener, lending structural integrity to the FOS 130.

Due to the noncontacting engagement of the heat tip 172 and the solder interconnect 152, the final thickness of the sold interconnect 152 is more predictably determined in relation to a selected heat, dwell time, and force provided by the heat tip 172. It has further been observed that for a given cycle time, the amount of heat and pressure can be relatively reduced, thereby improving the structural integrity of the soldered joint by reducing the incidence rate of cracked pads, and reducing residual stresses in the pads.

Use of the stainless steel layer 180 also advantageously reduces the rate at which carbon from the polymeric layer 146 otherwise builds up on the heat bar tip 172, leading to undesirable discoloring of the FOS 130.

Preferably, as shown in all the pertinent FIGS., a discontinuous opening 184 is formed in the FOS 130 adjacent the pads 140, 156 and of a sufficient proximity and size for a user to view the operable engagement of the pads 140, 156 with the solder interconnect 152 under the polymeric layer 140. This permits inspections of the alignment and quality of the soldered joints during manufacturing and inspection.

Figure 10:
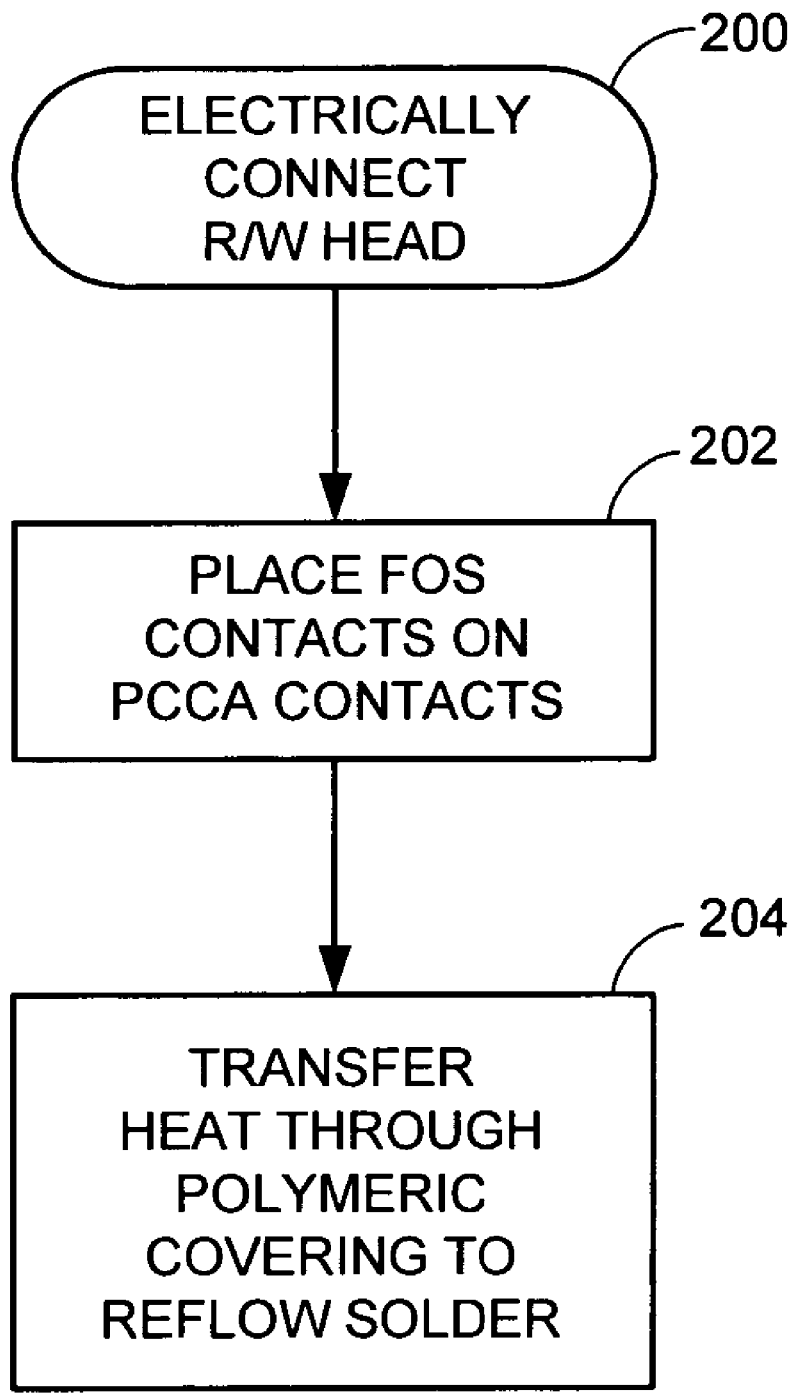
FIG. 10 is a flowchart of a method for connecting a read/write head to a PCCA in accordance with embodiments of the present invention.

FIG. 10 is a flowchart of a method 200 for electrically connecting the read/write head to the PCCA 132 in accordance with embodiments of the present invention. In block 202 the FOS 130 pads 140 are placed in alignment with the pads 156 of the PCCA 132. The solder interconnects 152 can be provided as part of either the FOS 130 or the PCCA 132. In block 204 heat is conducted through the polymeric covering 140 of the FOS 130 in order to reflow the solder interconnects 152, thereby electrically connecting the FOS 130 to the PCCA 132.

Summarizing, the embodiments of the present invention generally contemplate a FOS (such as 130) for electrically connecting a data transfer head (such as 118) with a PCCA (such as 132). The embodiments of the present invention are particularly useful in electrically joining miniaturized components, such as electrical pads of less than twelve microns thick. The FOS comprises a polymeric layer (such as 146), and an electrical trace (such as 134, 140) supported by the polymeric layer. The electrical trace comprises an uninsulated pad surface (such as 150) configured for electrically engaging a solder interconnect (such as 152) of the PCCA. The polymeric layer comprises a continuous portion (such as 158) covering the pad and opposing the pad surface.

In some embodiments the polymeric layer comprises a polyimide member. The FOS can additionally have a stiffener layer (such as 180) attached to the polymeric layer opposite the electrical trace. The stiffener layer can comprise an electrically conductive member, such as stainless steel.

Preferably, the polymeric layer defines a discontinuous opening (such as 184) adjacent the pad and of a sufficient proximity and size to disclose the operable engagement of the pad with the solder interconnect under the polymeric layer.

Some embodiments contemplate a method comprising providing a FOS comprising an electrical trace and a polymeric covering, contactingly engaging a pad portion of the trace with a solder interconnect portion of a circuit (such as 202), and conducting heat through the polymeric covering to reflow the solder interconnect, thereby electrically connecting the FOS to the circuit (such as 204).

Preferably, the providing a FOS step is characterized by providing a polymeric covering comprising a polyimide material.

The providing step can be characterized by providing an observation opening in the polymeric covering adjacent to the pad portion, and further comprising, during the contactingly engaging or the conducting heat steps, observing the engagement of the pad portion and the solder interconnect through the observation opening.

Preferably, the conducting heat step is characterized by simultaneously connecting two pad portions to respective solder interconnects with a flat tip heat bar.

In some embodiments an additional electrically conductive layer is added to the polymeric layer, such as a stainless steel layer. In these embodiments the conducting heat step is characterized by conducting heat through both the polymeric covering and the electrically conductive layer to reflow the solder interconnect.

The embodiments of this method are useful for electrically connecting a FOS defining a thickness between the pad surface and the opposing surface attached to the polymeric layer of less than twelve microns.

Advantageously, the conducting heat step is characterized by pressingly engaging against the solder interconnect with a heat bar without contactingly engaging either the electrical trace or the solder interconnect.

In some embodiments a data storage device is provided, comprising a data transfer head in a data storing and retrieving relationship with a storage medium, and means for electrically connecting the head with a controlling processor. The means for electrically connecting can be characterized by conducting sufficient heat from a heat bar through a protective member supporting an electrical contact to reflow a solder interconnect. The means for electrically connecting can be characterized by imparting mechanical pressure from the heat bar to the solder interconnect without contactingly engaging either the electrical contact or the solder interconnect.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed. For example, the particular elements may vary depending on the particular processing environment without departing from the spirit and scope of the present invention.

In addition, although the embodiments described herein are directed to a data storage system, it will be appreciated by those skilled in the art that the claimed subject matter is not so limited and various other processing systems can utilize the embodiments of the present invention without departing from the spirit and scope of the claimed invention.

What is claimed is:

1. A flex on suspension (FOS) assembly for electrically connecting a data transfer head with a printed circuit cable assembly (PCCA), the FOS comprising:
   a polymeric layer; and
   an electrical trace supported by the polymeric layer, the electrical trace comprising an electrically conductive pad with opposing first and second surfaces bounded by overall length and width dimensions of said pad, the first surface configured for electrically engaging a solder interconnect of the PCCA, wherein the polymeric layer comprises a continuous portion which fully covers the second surface, and wherein the polymeric layer defines a discontinuous opening adjacent the pad and of a sufficient proximity and size to disclose the operable engagement of the pad with the solder interconnect between the FOS and the PCCA.

2. The FOS of claim 1 wherein the polymeric layer comprises a polyimide material through which heat is transferred to reflow said solder interconnect.

3. The FOS of claim 1 comprising a stiffener layer attached to the polymeric layer opposite the pad.

4. The FOS of claim 3 wherein the stiffener layer comprises an electrically conductive material through which heat is transferred to reflow said solder interconnect.

5. The FOS of claim 1, wherein the FOS is electrically connected to the PCCA by steps comprising:
   contactingly engaging the first surface with a solder interconnect portion of the PCCA; and
   conducting heat through the polymeric layer to the pad to reflow the solder interconnect.

6. The FOS of claim 1 wherein the electrical trace defines a thickness between the first pad surface and the opposing second surface of less than twelve microns.

7. The FOS of claim 1 in combination with said PCCA, wherein the solder interconnect of the PCCA is enclosed on a first set of opposing sides by a dielectric.

8. The FOS of claim 7 in combination with said PCCA, wherein the solder interconnect of the PCCA is enclosed on a second set of opposing sides by the electrical trace and an electrical contact pad.

9. The FOS of claim 1 in combination with said PCCA, wherein the electrical trace is suspended adjacent the top of the solder interconnect of the PCCA by the polymeric layer.

10. The combination of claim 9, wherein an electrical contact pad is supported adjacent the bottom of the solder interconnect of the PCCA by a base layer.

11. The combination of claim 10, wherein an insulating material is positioned in contacting engagement with both the electrical contact pad and the base layer.

12. A method comprising:
   providing a flex on suspension (FOS) assembly for electrically connecting a data transfer head to a printed circuit cable assembly (PCCA), the FOS comprising a polymeric layer and an electrical trace supported by the polymeric layer, the electrical trace comprising an electrically conductive pad with opposing first and second surfaces bounded by overall length and width dimensions of said pad, the first surface configured for electrically engaging a solder interconnect of the PCCA, wherein the polymeric layer comprises a continuous portion which fully covers the second surface, and wherein the polymeric layer defines a discontinuous opening adjacent the pad and of a sufficient proximity and size to disclose the operable engagement of the pad with the solder interconnect between the FOS and the PCCA;

contactingly engaging the first surface with a solder interconnect portion of the PCCA; and conducting heat through the polymeric layer to the pad to reflow the solder interconnect, thereby electrically connecting the FOS to the PCCA.

13. The method of claim 12 wherein the providing step is characterized by providing an observation opening in the polymeric layer adjacent to the pad to facilitate observation of the engagement of the pad portion and the solder interconnect through the observation opening.

14. The method of claim 12 wherein the trace is characterized as a first trace and the pad is characterized as a first pad, wherein the providing step further comprises providing the FOS with a second trace comprising a second pad nominally identical to the first pad, and wherein the conducting heat step is characterized by simultaneously connecting the respective first and second pads to respective first and second solder interconnects.

15. The method of claim 12 wherein the conducting heat step is characterized by using a heat bar with a flat tip.

16. The method of claim 12 wherein the providing a FOS step is characterized by a polymeric covering comprising a polyimide material.

17. The method of claim 12 wherein the providing a FOS step is characterized by an electrically conductive layer attached to the polymeric layer opposite the electrical trace.

18. The method of claim 17 wherein the providing a FOS step is characterized by placing an electrically conductive layer comprising a stainless steel material on the polymeric layer.

19. The method of claim 17 wherein the conducting heat step is characterized by conducting heat through both the polymeric layer and the electrically conductive layer to reflow the solder interconnect.

20. The method of claim 12 wherein the providing a FOS step is characterized by the trace defining a thickness of less than twelve microns.

21. The method of claim 12 wherein the conducting heat step is characterized by pressingly engaging the polymeric layer with a heat bar.

* * * * *

UNITED STATES PATENT AND TRADEMARK OFFICE
CERTIFICATE OF CORRECTION

PATENT NO. : 7,646,567 B2
APPLICATION NO. : 11/168792
DATED : January 12, 2010
INVENTOR(S) : Backlund et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 493 days.

Signed and Sealed this

Sixteenth Day of November, 2010

David J. Kappos
*Director of the United States Patent and Trademark Office*